United States Patent [19]

Politis et al.

[11] Patent Number: 5,574,838
[45] Date of Patent: Nov. 12, 1996

[54] METHOD OF IMPROVING THE EFFICIENCY OF DATA DELIVERY TO AN OUTPUT DEVICE

[75] Inventors: Elias Politis, Nepean; Jean-Sébastien Thériault, Hull, both of Canada

[73] Assignee: National Research Council of Canada, Ottawa, Canada

[21] Appl. No.: 426,977

[22] Filed: Apr. 24, 1995

[51] Int. Cl.$^6$ .................................................. G06T 11/00
[52] U.S. Cl. .................................................. 395/140
[58] Field of Search .................... 395/140, 139, 395/142; 345/133, 134

[56] References Cited

U.S. PATENT DOCUMENTS 4,884,440  12/1989  Berthel .................... 364/518
5,462,438  10/1995  Becker et al. .................... 434/430
5,485,564   1/1996  Miura .................... 395/140

*Primary Examiner*—Phu K. Nguyen
*Attorney, Agent, or Firm*—Neil Teitelbaum & Associates

[57] ABSTRACT

This invention relates to a method of data output. In data collection and analysis, it is often essential that the information be displayed in a two dimensional graphical representation. Each datum is represented by a point (t,u). By displaying each point in the data, a graphical image is created. A method is disclosed for improving data delivery of an image to an output device. The method involves grouping the points into columns and selecting 4 points from each column having the minimum and maximum values along each axis. These selected points are then stored. These stored points can then be output to form a two dimensional graphical representation of the data.

12 Claims, 2 Drawing Sheets

METHOD OF IMPROVING THE EFFICIENCY OF DATA DELIVERY TO AN OUTPUT DEVICE

FIELD OF THE INVENTION

This invention relates generally to data output, and more particularly to a method of improving the efficiency of data delivery to a device for display.

BACKGROUND OF THE INVENTION

In data collection and analysis, it is often essential that the information be displayed in a two dimensional (2-D) graphical representation. In such a 2-D representation, each datum is represented by a point (t,u). By displaying each point in the data, a graphical image is created.

When printing or displaying a graph of electronic data, the smallest element of resolution, termed a pixel, limits the overall resolution of the output. For example, on a 300 dot per inch (DPI) printer using an 11 inch by 17 inch sheet of paper, the output resolution for the graph could not exceed 3300 by 5100 pixels. Using a video display, one is more likely to achieve viewable areas of 1000 pixels by 1000 pixels. For electronic data with tens of thousands, or even hundreds of thousands of points, it is likely that more than one point will fall within a column one pixel in width.

Some systems such as flight recorders acquire large quantities of electronic data for analysis. One means of analyzing such electronic data is through a graph. In this instance, there exists a physical limitation on the resolution of the graph when electronically produced. Often, the resolution of an available output device is lower than that of the electronic data. Thus, displaying the graph requires some loss of resolution.

Often an entire quantity of electronic data is sent to an output device regardless of a large difference in the resolution of the data and the resolution of the output device. The electronic data is then displayed point by point. Of course, for large quantities of electronic data, it is time consuming to display a graph in this manner. Furthermore, it is likely that the same one pixel will be displayed or printed for each of a number of points. As the smallest element of resolution, a pixel can only be "on" or not "on", therefore, two or more operations displaying or printing the same pixel should have the same result as one such operation.

In the past, two dimensional graphs with axes t and u were electronically displayed by sending an entire quantity of electronic data comprising a plurality of points to an output device where the electronic data was displayed point by point. As the output resolution was often lower than that of the data, in order to display the data it was quantized to reflect values that were capable of being displayed.

One such method of quantization involved assigning to each pixel a range of values for t and u such that a point falling within the range of values for the pixel would print that pixel or display that pixel. For large quantities of data, this often resulted in repetition where two points fell within the range of the identical pixel. Further, for very large electronic data collections, this consumed both time and bandwidth.

In order to reduce the time and bandwidth required to print or display the graph, it is known in the art to sample the electronic data at predetermined intervals, thereby reducing the overall number of points sent to an output device. However, reducing the overall number of points through sampling can result in an inaccurate graphical representation of the original electronic data.

It is therefore an object of the current invention to provide a method of reducing the quantity of electronic data transmitted to an output device for producing a two dimensional graph on said output.

SUMMARY OF THE INVENTION

In a first broad aspect this invention seeks to provide a method for improving data delivery of an image to a device comprising the steps of: obtaining a first plurality of data points corresponding to the image, each data point having an address (t, u) on a two dimensional coordinate system; grouping the first plurality of data points into an integral number of linear divisions [columns], wherein more than two data points from the first plurality of data points are grouped into at least one linear division; selecting, from each of a plurality of linear divisions two data points representing minimum and maximum values of one of t and u to form a second plurality of data points; and temporarily storing said second plurality of data points in a memory means until it is requested.

In accordance with another aspect of the invention, a method for improving data delivery of an image to a device is provided which comprises the steps of: obtaining a first plurality of data points corresponding to the image, each point having an address (t,u) on a two dimensional coordinate system; grouping the first plurality of data points into an integral number of linear divisions [columns], wherein more than two data points from the first plurality of data points are grouped into at least one linear division; selecting, from each of a plurality of linear divisions, four data points representing minimum and maximum values of each of t and u to form a second plurality of data points; and storing said second plurality of data points in a memory device.

Advantageously, the invention provides a method of transforming a large high resolution data set to a smaller lower resolution data set that is compatible in resolution to that of an output device it is being provided to. In performing the transformation the informational content of the transformed data is equivalent to the maximum mount of information that the output device is capable of displaying. Thus the output device receiving the smaller lower resolution data set, will have the same image displayed as if it had received the large high resolution data set. Of course, that is not to say that the high resolution data set is equivalent to the smaller lower resolution data set.

DETAILED DESCRIPTION

Exemplary embodiments of the invention will now be described in conjunction with the following figures in which.

Figure 1:
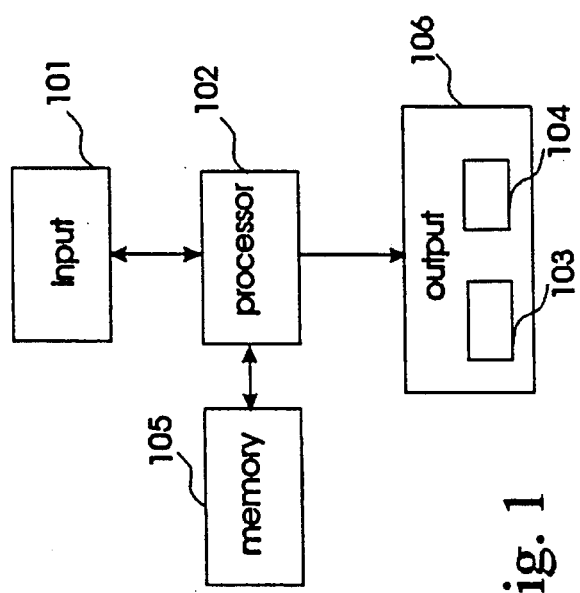
FIG. 1 is a block diagram of computer processing system.

Referring now to FIG. 1, a data processing system 100 and display is shown. An input device which is typically in the form of a tape drive (flight recorder) or hard drive is coupled to a processor 102 for providing the processor with electronic data. The processor is coupled to a memory 105 for retrieval and storage of data. A block 106 labeled output includes a first output device 103 in the form of a video display and a printer 104.

Figure 2:
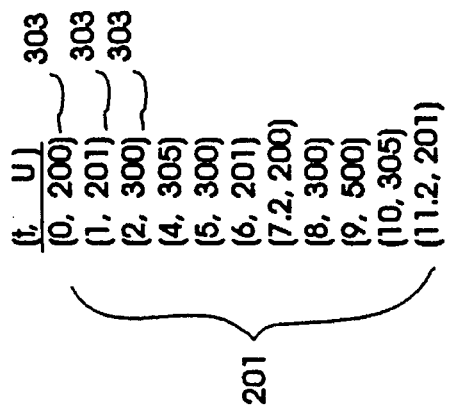
FIG. 2 is a table showing a sample first set of data points.
Figure 3:
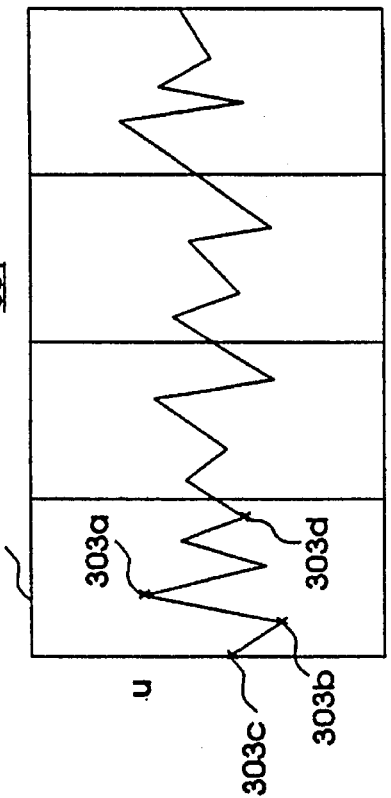
FIG. 3 is a graph of data points divided into linear divisions.

Turning now to FIG. 2 and FIG. 3, a first set of data points 201 from an input device 101, such as a flight recorder, is provided to the processor 102 for the purpose of analysis and output. Each data point 202 from the first set of data points 201 is represented by two values (t,u) being for example u, the altitude of an aircraft and t, representing the time 203 respectively. The first set of data points 201 can be represented in a two dimensional graph 301 having two axes t and u on an output device such as the printer 103 or the video display 104.

Both the printer 103 and the video display 104 are digital devices having pixels representing the smallest element capable of being displayed. When the first set of data points 201 is output to one of the output devices 106, many individual points 202 will likely fall within an identical pixel.

It has been found that only a subset of the first set of data points 201 needs to be output to the output device 106 in order to produce a correct graph 301 of the first set of data points 201. This can result in increased efficiency both in transmitting the points 202 and in displaying or printing them.

Figures 4, 5:
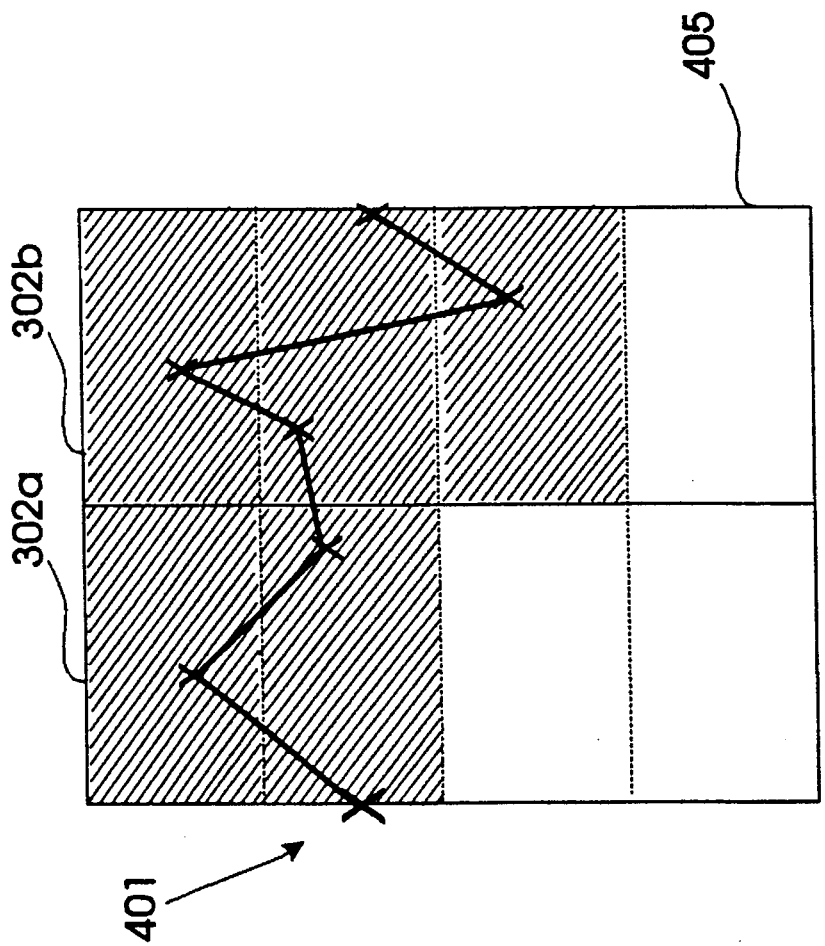
FIG. 4 shows two adjacent linear divisions from the graph of FIG. 3.
FIG. 5 is a table of a sample second set of data points.

The current invention utilizes a method whereby the first set of data points 201 is grouped along at least one axis of the graph 301 into an integral number of linear divisions 302 such that at least one of the linear divisions 302 contains a plurality of points 303. It is preferable that each linear division 302 correspond to a column one pixel wide 405 along a corresponding axis on the output graph 401 of FIG. 4.

In accordance with the method of this invention, within linear divisions 302, the points 303 having a minimum value for altitude (u) 303a a the maximum value for altitude (u) 303b as well as the points having a minimum value for time (t) 303c and a maximum value for time (t) 303d are selected. The method is repeated for each linear division 302 such that the total number of points selected does not exceed 4n where n is the number of linear divisions into which the graph 301 has been subdivided.

The selected points form a second set of data points 501 which are stored in the memory 105. This second set of data points 501 can be provided to an output device 106 for display.

In a preferred embodiment, within each linear division 302 when the points 303 are displayed, they are interconnected to form the graph 301. The point having the minimum value t of time 303c is connected to the point having the maximum value u of altitude 303a which in turn is connected to the point having the minimum value u of altitude 303b which in turn is connected to the point having the maximum value t of time 303d. The point having the maximum value t of time 303d within a linear division such as 302a is connected to the point having the minimum value t of time 303c within the adjacent linear division 302b to provide continuity within the graph 301.

The order in which the point having the maximum value u of altitude 303a and the point having the minimum value u of altitude 303b are interconnected, is arbitrary, and alternatively, the order of these two points 303 can be reversed within each linear division 302.

Selecting the second set of data points 501 in this manner, will result in a reduction from a number of data points 303 in the first set of data points 201 to a maximum of 4 data points from each linear division 302 in the second set of data points 501 being required to produce the graph 301. It is evident that the benefits of the method in accordance with this invention increase as the size of the first set of data points 201 grows much larger than the number of linear divisions 302.

In a preferred embodiment of this invention, the graph formed by the first set of data points 201 is contiguous across all data points 303.

In an alternative embodiment the second set of points 501 may be further transformed into a different two dimensional coordinate system such as that of the display 105 or of the printer 104.

Of course, numerous other embodiments may be envisaged without departing form the spirit and scope of the invention.

What we claim is:

1. A method for improving data delivery of an image to a device comprising the steps of:
   a) obtaining a first plurality of data points corresponding to the image, each data point having an address (t, u) on a two dimensional coordinate system;
   b) grouping the first plurality of data points into an integral number of linear divisions, wherein more than two data points from the first plurality of data points are grouped into at least one linear division;
   c) selecting, from each of a plurality of linear divisions two data points representing minimum and maximum values of one of t and u to form a second plurality of data points; and
   d) temporarily storing said second plurality of data points in a memory means until it is requested.

2. The method of claim 1 further comprising the step of providing the second plurality of data points to the device.

3. The method of claim 1 further comprising the step of transforming the second plurality of data points to a second two dimensional coordinate system.

4. The method of claim 1 further comprising the step of analyzing the stored second plurality of data points for particular features or events.

5. The method of claim 1 further comprising the step of searching within the stored second plurality of data points for predetermined features or events to form a third plurality of data points.

6. The method of claim 5 further comprising the step of searching within the first plurality of data points for the data points corresponding to the data points within the third plurality of data points.

7. A method for improving data delivery of an image to a device comprising the steps of:
   a) obtaining a first plurality of data points corresponding to the image, each point having an address (t,u) on a two dimensional coordinate system;
   b) grouping the first plurality of data points into an integral number of linear divisions, wherein more than two data points from the first plurality of data points are grouped into at least one linear division;
   c) selecting, from each of a plurality of linear divisions, four data points representing minimum and maximum values of each of t and u to form a second plurality of data points; and
   d) storing said second plurality of data points in a memory device.

8. The method of claim 7 further comprising the step of providing the second plurality of data points to an output device.

9. The method of claim 7 further comprising the step of transforming the second plurality of data points to a second two dimensional coordinate system.

10. The method of claim 7 further comprising the step of analyzing the stored second plurality of data points for particular features or events.

11. The method of claim 7 further comprising the step of searching within the stored second plurality of data points for particular features or events to form a third plurality of data points.

12. The method of claim 11 further comprising the step of searching within the first plurality of data points for the data points corresponding to the data points within the third plurality of data points.

* * * * *